(12) United States Patent
Thompson

(10) Patent No.: US 6,731,172 B2
(45) Date of Patent: May 4, 2004

(54) DOHERTY POWER AMPLIFIER WITH INTEGRATED QUARTER WAVE TRANSFORMER/COMBINER CIRCUIT

(75) Inventor: Philip H. Thompson, Mount Vernon, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 38 days.

(21) Appl. No.: 09/761,100

(22) Filed: Jan. 16, 2001

(65) Prior Publication Data

US 2002/0093383 A1 Jul. 18, 2002

(51) Int. Cl.[7] ............................................. H03F 3/68
(52) U.S. Cl. ........................................ 330/295; 330/302
(58) Field of Search .............................. 330/124 R, 245, 330/302

(56) References Cited

U.S. PATENT DOCUMENTS 5,757,229 A * 5/1998 Mitzlaff ................... 330/124 R
6,262,629 B1 * 7/2001 Stengel et al. ........... 330/124 R

OTHER PUBLICATIONS

Doherty, W.H.; *A New High Efficiency Power Amplifier for Modulated Waves*; Proceedings of the Institute of Radio Engineers; vol. 24, No. 9; pp. 1163–1182, Sep., 1936.

* cited by examiner

Primary Examiner—Steven J. Mottola
(74) Attorney, Agent, or Firm—Mintz Levin Cohn Ferris Glovsky & Popeo, P.C.

(57) ABSTRACT

A Doherty amplifier system including a quarter wave transformer/combiner circuit which may be implemented as a low cost radio frequency integrated circuit, thereby absorbing and minimizing the effects of parasitics such as bond wires and stray capacitance. The quarter wave transformer/combiner circuit may be a lumped pi network configured as an integral number of sections coupled in parallel, with each such section comprising a series combination of a shunt inductance, series capacitance, and shunt inductance. The circuit may also provide bias voltage to the carrier and peaking amplifiers and/or maintain DC isolation therebetween. The circuit may also decrease the load impedance presented to the carrier amplifier as input power increases, thus allowing the efficiency of the system to be kept relatively constant over a prescribed power range.

8 Claims, 3 Drawing Sheets

DOHERTY POWER AMPLIFIER WITH INTEGRATED QUARTER WAVE TRANSFORMER/COMBINER CIRCUIT

BACKGROUND OF THE INVENTION

1. Field of the Invention

The present invention relates to Doherty amplifiers, and, more specifically, to the integration of a quarter wave transformer/combiner circuit with a Doherty amplifier.

2. Related Art

The Doherty amplifier, developed in the 1930's, is a linear power amplifier that operates at low power consumption levels and high efficiencies. For an overview of the Doherty amplifier, see Doherty, W. H., *A New High Efficiency Power Amplifier For Modulated Waves*, Proceedings of the Institute of Radio Engineers, Vol. 24, No.9, pp. 1163–82, September 1936, which is hereby incorporated by reference.

Although the Doherty amplifier has advantages in certain applications, problems have been encountered with applying the Doherty amplifier to low cost radio frequency integrated circuits (RFIC) for use in wireless communications equipment. In the past, Doherty amplifiers were designed at low enough frequencies and/or high enough impedances that parasitics such as bond-wire inductance and stray capacitance were not a significant factor. As such, topologies emerged for these applications where portions of the amplifier system were implemented off-chip, that is, outside the RFIC containing the Doherty amplifier, and downstream from any impedance matching circuit.

A problem with these topologies is that parasitic elements such as bondwires, stray capacitance, and losses in the matching circuit, which become more prominent at the high frequencies inherent in RF applications, can degrade the performance of the Doherty amplifier. Moreover, any phase shift that occurs in the matching circuit can further degrade the performance of the Doherty amplifier.

SUMMARY

The present invention provides a Doherty amplifier system where a quarter wave transformer/combiner circuit (QWTCC) is directly coupled to the outputs of the carrier and peaking amplifiers of a Doherty amplifier. The QWTCC achieves about a relative net 90° phase shift between the carrier and peaking amplifier outputs so that the amplifier outputs, after the phase shifting, are approximately in phase. The QWTCC then combines the relative phase-shifted outputs together at one or more nodes. An impedance matching circuit may be coupled between the one or more nodes and a system output in order to achieve a desired impedance at the system output. The QWTCC together with the Doherty amplifier may be implemented on one RF integrated circuit chip.

The QWTCC may be implemented as a plurality of circuit elements in a "pi" network. In one example, the QWTCC includes an integral number of pi sections coupled in parallel, each section comprising a series combination of a shunt inductance (L), series capacitance (C), and shunt inductance (L). Each section may be coupled in parallel between the outputs of the carrier and peaking amplifiers. Each of the pi sections may also be coupled to a node, and the nodes for all the sections may form one or more outputs of the QWTCC. An impedance matching circuit may then be coupled between the one or more QWTCC outputs and a system output.

The shunt inductance elements in this example may be configured to provide collector or drain bias to the carrier and peaking amplifiers. These shunt inductors may be realized using bond wires that are generally used to connect an integrated circuit to its external circuitry. The series capacitance elements may be configured to provide DC isolation between the amplifiers and may be integrated directly on the RFIC.

The load impedance presented by the QWTCC to the carrier amplifier in this example may decrease as the input power increases. This allows the efficiency of the system to be held relatively constant over a selected power range.

Other systems, methods, features and advantages of the invention will be or will become apparent to one with still in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
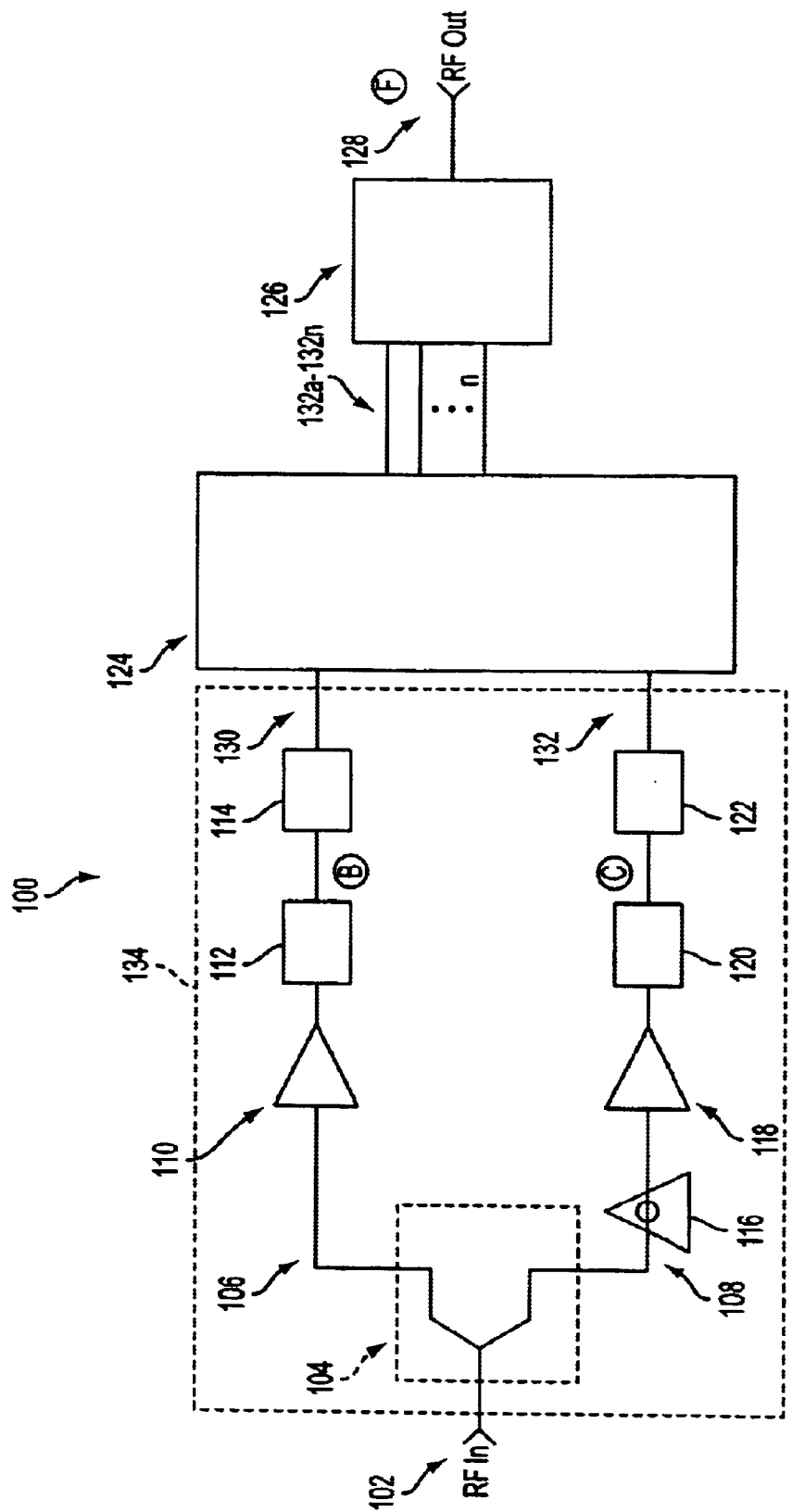
FIG. 1 is a block diagram of a Doherty amplifier system according to the invention.

FIG. 1 illustrates an embodiment of a Doherty amplifier system 100 in accordance with the teachings of the present invention. Referring to FIG. 1, the Doherty amplifier system 100 includes a signal splitter 104 which receives an RF input signal 102, and splits the same into separate portions which are directed respectively along signal paths 106 and 108.

A phase shifter 116 is placed along one of the paths to phase shift the portion of the input signal directed along that path by approximately 90° relative to the other portion of the input signal directed along the other path. In the embodiment shown in FIG. 1, the phase shifter 116 is situated along the lower path 108, but it should be appreciated that embodiments are possible where the phase shifter is placed along the upper path 106, or where phase shifters are placed along both paths, and achieve approximately a net 90° phase shift between the signals along the two paths. For purposes of this disclosure, an approximate phase shift of 90° is a phase shift of 90°±10°.

Gain blocks 110 and 118 are respectively situated along the upper and lower paths 106, 108 in order to boost the RF signals appearing on each path, and also to provide reverse isolation so that the input phase shifter circuit 116 and input power splitter circuit 104 are not disturbed by loading effects.

The outputs of gain blocks 110 and 118 are respectively input to matching circuits 112 and 120. The matching circuits transform the input impedance of the transistors 114 and 122 to an appropriate load impedance for the amplifier blocks 110 and 118, respectively. The resulting signals output from the matching circuits and provided to the control inputs of transistors 114 and 122 may be of approximately equal amplitude with a net phase shift of 90 degrees. In the case where the transistors 114 and 122 are implemented as bipolar junction transistors (BJT), the control inputs of the transistors 114 and 122 are the bases of these transistors. In the case where the transistors 114 and 122 are implemented as field effect transistors (FET), the control inputs of the transistors are the gates of these transistors.

In the embodiment illustrated in FIG. 1, transistor 114 is referred to as the carrier amplifier and is a linear or quasi-linear amplifier having a conduction angle greater than or equal to 180 degrees. In operation, it resembles a biased class AB or B amplifier. Transistor 122 is referred to as the peaking amplifier and only conducts on the peaks of the input signal. In operation, it resembles a biased class C amplifier.

The outputs 130, 132 of the two amplifiers 114, 122 are input to quarter wave transformer/combiner circuit (QWTCC) 124. In the case where the amplifiers are implemented as BJTs, the outputs 130, 132 may be taken from the collectors of the transistors. In the case where the amplifiers are implemented as FETs, the outputs may be taken from the drains of the two transistors. Together, the splitter 104, signal paths 106, 108, gain blocks 110, 118, matching circuits 112, 120, and amplifiers 114, 122 will be referred to as the front-end of the Doherty amplifier system. In FIG. 1, this front-end is identified with numeral 134.

The QWTCC 124 is preferably directly coupled to the outputs 130, 132 of the two amplifiers 114, 122. The QWTCC 124 relatively shifts the two outputs 130, 132 by approximately 90° so they are approximately in phase with one another. It then combines the two relative phase shifted signals at one or more nodes 132a, 132b, 132n, and may then provide the same as outputs.

Matching circuit 126 receives the QWTCC outputs 132a–132n, and produces a system output 128, while transforming the output impedance of the QWTCC 124 at outputs 132a–132n to a desired output impedance at system output 128.

By directly coupling the QWTCC 124 to the outputs of the two amplifiers 114, 122, the QWTCC 124 as well as the front-end 134 of the system (comprising splitter 104, signal paths 106, 108, phase shifter 116, gain blocks 110, 118, matching circuits 112, 120, and amplifiers 114, 122) can be implemented as a single RFIC including its bondwires, thereby eliminating the parasitics that would accompany implementations where the QWTCC 124 is implemented off-chip and downstream from matching circuit 126.

The QWTCC 124 may be configured to perform other functions besides relative phase shifting and combining of the outputs of the two amplifiers and providing a load impedance to the carrier amplifier which decreases as the input power increases. For example, the QWTCC 124 may be coupled to provide bias current to the outputs 130, 132 of the two amplifiers 114, 122. The QWTCC 124 may also be configured to provide DC isolation between the outputs of the two amplifiers. It should be appreciated that, although the embodiment illustrated in FIG. 1 is shown as including gain blocks 110, 118, and matching circuits 112, 120, and 126, it should be appreciated that embodiments are possible where these components are avoided, or where only one or more of these components are included.

Figure 2:
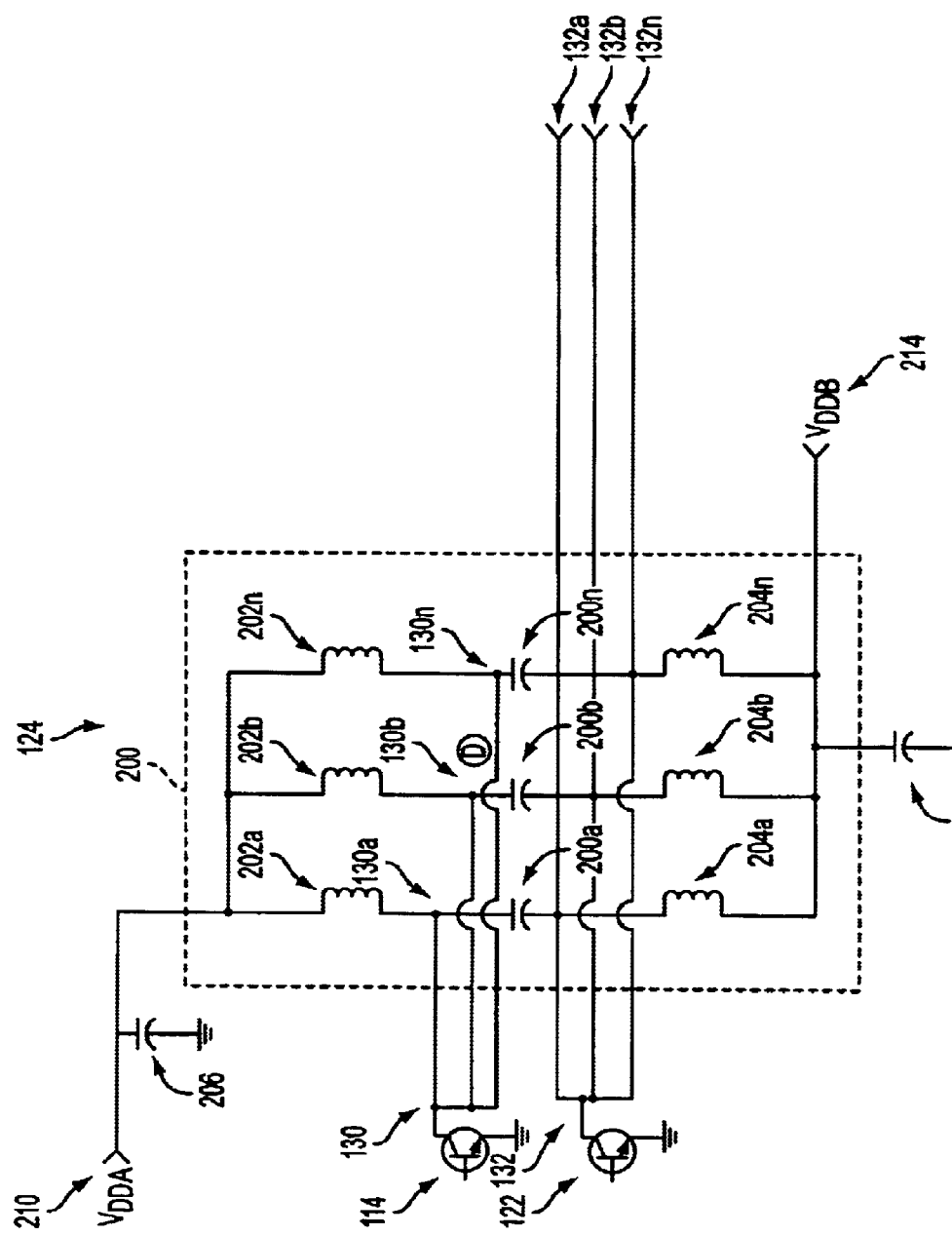
FIG. 2 is a circuit diagram of an example implementation of a QWTCC configured for use in the system of FIG. 1.

The QWTCC 124 may be implemented as a pi network. In one example, illustrated in FIG. 2, the QWTCC 124 is implemented as a pi network, and includes a core section 200 which comprises an integral number of L-C-L pi sections connected in parallel between the outputs 130, 132 of the carrier and peaking amplifiers 114, 122. For illustrative purposes only, a QWTCC 124 is shown in FIG. 2 which includes three such pi sections is shown, but it should be appreciated that examples are possible in which n such pi sections are included, where n is an integer greater than or equal to 1.

By allowing the QWTCC to be realized as an integer number of parallel pi sections, the circuit layout can be designed such that each section connects to a bank of transistors, where multiple banks or arrays of transistors comprise the total output stage. In general, higher power amplifiers will have more sections of transistor banks which is consistent with breaking the QWTCC into parallel sections which in turn is also consistent with the lower impedances required by the higher power amplifiers.

In the illustrated example, the integer number "n" pi sections each comprise a shunt inductance $202a$, $202b$, . . . $202n$, a series capacitance $200a$, $200b$, . . . $200n$, and a shunt inductance $204a$, $204b$, . . . $204n$, coupled in series. The output 130 of the carrier amplifier 114 in this example is coupled to each of the pi sections at a point $130a$, $130b$, . . . $130n$ intermediate between the shunt inductance $202a$, $202b$, . . . $202n$, and the series capacitance $200a$, $200b$, . . . $200n$. In addition, the output 132 of the peaking amplifier 122 in this example is coupled to each of the pi sections at a point $132a$, $132b$, . . . $132n$ intermediate the series capacitance $200a$, $200b$, . . . $200n$, and the shunt inductance $204a$, $204b$, . . . $204n$ The distal ends of shunt inductances $202a$, $202b$, . . . $202n$ (the ends opposed to those coupled to intermediate points $130a$, $130b$, . . . $130n$) are each coupled to power supply voltage $V_{DDA}$, identified with numeral 210 in the figure, which in turn is coupled to capacitor 208, which provides a low AC impedance at the frequency of operation. Similarly, the distal ends of shunt inductances $204a$, $204b$, . . . $204n$ (the ends opposed to those coupled to intermediate points $132a$, $132b$, . . . $132n$) are each coupled to power supply voltage $V_{DDB}$, identified with numeral 214 in the figure, which in turn is coupled to capacitor 212, which a low AC impedance at the frequency of operation. The power supply voltage $V_{DDA}$ is set so that an appropriate DC bias voltage is provided to the output 130 of amplifier 114 through shunt inductances $202a$, $202b$, . . . $202n$. Similarly, the power supply voltage $V_{DDB}$ is set so that an appropriate DC bias voltage is provided to the output 132 of amplifier 122 through shunt inductances $204a$, $204b$, . . . $204n$.

The QWTCC in this example is configured to achieve a phase shift of approximately 90 degrees for the signal amplified by the carrier amplifier so that this signal is in phase with the signal amplified by the peaking amplifier. These in-phase signals are combined at nodes $132a$, $132b$, $132n$. The shunt inductances in this example are configured to absorb any parasitic bond wire inductance that may be present. The series capacitances $200a$, $200b$, $200c$ have the incidental benefit of providing DC isolation between the outputs 130, 132 of the amplifiers 114, 122. The series capacitances may be realized directly on an RFIC, and the shunt inductances may be realized using bond wires (and possibly some trace elements) on an RFIC.

The QWTCC 124 is also configured to function as a classical quarter wave transformer which, as is known, not only provides approximately 90° phase shift at the desired frequency, but also performs an impedance transformation function. More specifically, if the characteristic impedance of the QWTCC is selected to be $Z_0$, as does a classical quarter wave transformer, the QWTCC can transform one impedance $Z_1$ to a higher or lower impedance $Z_2$ if the characteristic impedance $Z_0$ is set to the geometric mean of $Z_1$ and $Z_2$. Thus, if the characteristic impedance of the QWTCC is set to R ohms, the QWTCC can transform 2R ohms to R/2 ohms, and vice-versa.

In this example, the QWTCC allows the impedance of the carrier amplifier load line to be decreased as the input power increases. This allows the efficiency of the system to be kept relatively constant over a prescribed power range.

To explain this, for the case of n integer sections in parallel, assume that, to deliver a given output power with a given supply voltage, the calculated load line for the carrier and peaking amplifiers is R ohms each, assuming each contributes equally at full power. Assume also that the effective parallel equivalent characteristic impedance of the QWTCC is designed to be R ohms, (that is, the characteristic impedance of each integer L-C-L section is designed to be n*R ohms) and that the matching circuit 125 is configured to match the system impedance (typically 50 ohms) at point F (see FIG. 1) down to an effective parallel equivalent impedance of R/2 ohms at the summing nodes 132a, 132b, . . . 132n (although the impedance at any one of the nodes is n*R/2).

For the case where the input power is low enough that the peaking amplifier 122 is not conducting, its output impedance is very high and the load impedance seen at each summing node is nR/2 ohms due to the operation of matching circuit 126. The QWTCC transforms the nR/2 ohms at each summing node to n2R ohms at each output 130a, 130b, . . . 130n of the carrier amplifier 114 (point D). Under this condition, the carrier amplifier 114 behaves like a single ended class AB amplifier with a 2R ohm load line.

As the input signal level increases, the peaking amplifier 122 begins to conduct and amplify the signal. The impedance looking back into the output 132 of the peaking transistor 122 from the summing nodes appears negative because the transistor 122 is pumping current into the node. The parallel combination of this impedance with the R/2 ohms due to the matching circuit 125 results in a relatively higher impedance at nodes 132a, 132b, . . . 132n that increases as the peaking amplifier's output signal increases.

As the input power continues to increase, the magnitude of this parallel impedance continues to increase. As the magnitude of this impedance increases, the impedance at the output 130 of the carrier amplifier (point D) decreases due to the inverting effect of the QWTCC. At the saturated output power where the peaking amplifier and the carrier amplifier are contributing equal power to the load, the impedance at the summing node (point E) is R ohms. The QWTCC transforms this R ohms to R ohms at the output 130 of the carrier amplifier 114.

Thus, as the input power increases, the effective load impedance to the carrier amplifier changes from 2R ohms to R ohms. Because the peaking amplifier also sees an R ohm load line at the saturated output power, the aggregate load line of the total circuit is R/2 ohms. Since the aggregate load line decreases by a factor of 4 (from 2R to R/2) as the input power increases by a factor of 4 (6 dB), the efficiency of the amplifier can be ideally held at a constant value over this power range.

Figure 3:
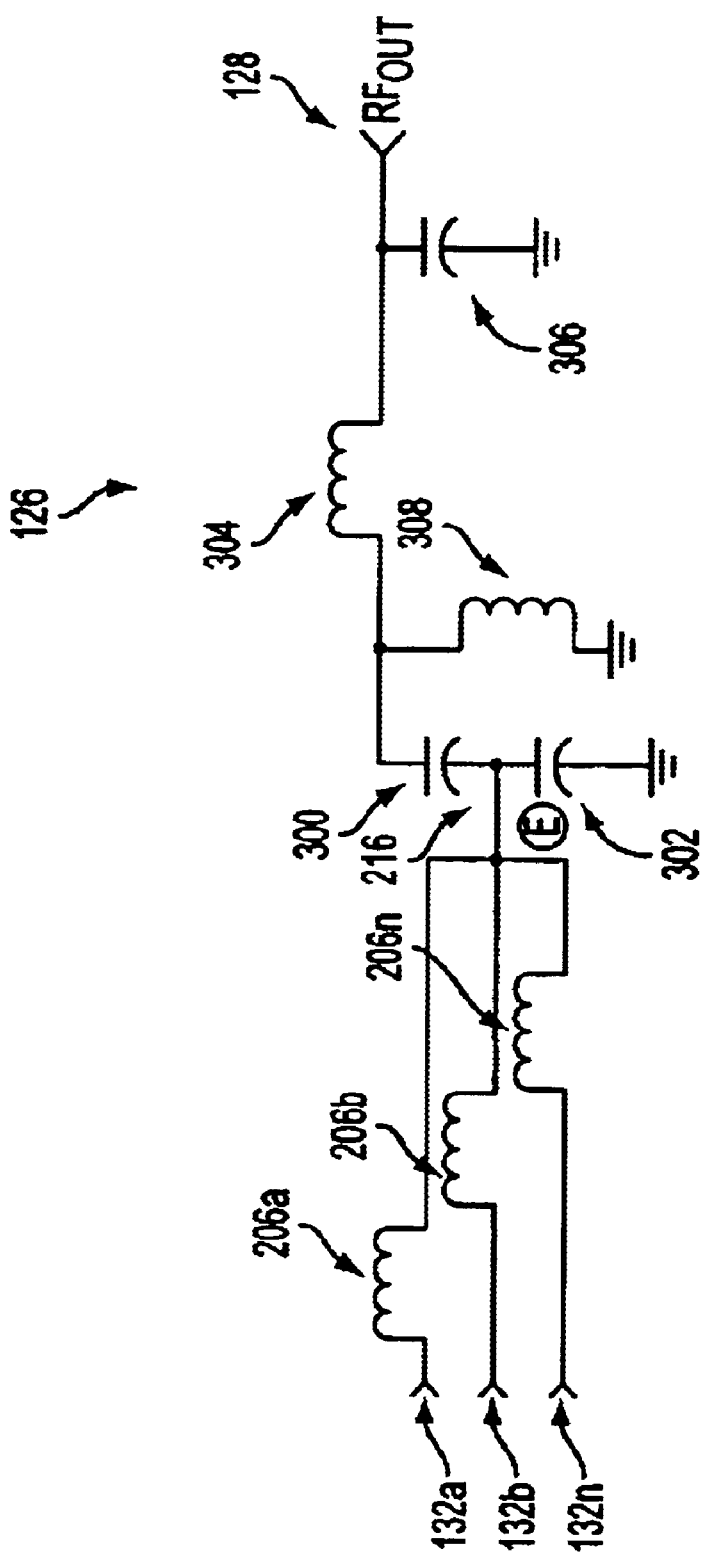
FIG. 3 is a circuit diagram of an example implementation of an impedance matching circuit for use in the system of FIG. 1.

An implementation example of matching circuit 126 is illustrated in FIG. 3. In this implementation example, nodes 132a, 132b, 132n are bond pads for an RFIC implementing a Doherty amplifier front end 134 and QWTCC 124. These bond pads are for coupling the RFIC to external circuitry. Inductors 206a, 206b, and 206n in this implementation example are output bond wires from the RFIC.

Inductors 206a, 206b, and 206n in conjunction with capacitor 302 comprise a low pass (L) matching section; capacitor 300 and inductor 308 comprise a high pass (L) matching section; and inductor 304 and capacitor 306 comprise a low pass (L) matching section. Although the matching circuit 126 in this example is implemented as three sections, it should be appreciated that other embodiments and implementations of the matching circuit are possible.

While various embodiments of the invention have been described, it will be apparent to those of ordinary skill in the art that many more embodiments and implementations are possible that are within the scope of the invention. Accordingly, the invention is not to be restricted except in light of the attached claims and their equivalents.

What is claimed is:

1. A Doherty amplifier system comprising:

an input splitter for splitting an input signal into first and second portions;

first and second signal paths for carrying respectively the first and second portions of the input signal;

one or more input phase shifters for realizing a net relative phase shift of approximately 90° between signals carried on the first and second signal paths;

a carrier amplifier having an output situated along a selected one of the first and second paths;

a peaking amplifier having an output situated along one of the first and second signal paths other than the selected one; and a quarter wave transformer/combiner integrated circuit coupled directly to the outputs of the carrier and peaking amplifiers for realizing a net relative phase shift of approximately 90° between the amplifier outputs so the two are approximately in-phase, and combining the two to form one or more output signals.

2. The system of claim 1, wherein the carrier and peaking amplifiers comprise bipolar junction transistors.

3. The system of claim 1, wherein the carrier and peaking amplifiers comprise field effect transistors.

4. The system of claim 1 further comprising a matching circuit coupled to the one or more outputs of the quarter wave transformer/combiner integrated circuit for transforming the output impedance of the quarter wave transformer/combiner integrated circuit to a desired impedance.

5. The system of claim 1 wherein the quarter wave transformer/combiner integrated circuit is configured to decrease the load impedance to the carrier amplifier as the input power increases.

6. A Doherty amplifier system comprising:

means for splitting an input signal into first and second potions;

first and second signal path means for carrying respectively the first and second portions of the input signal;

phase shifting means for realizing a net relative phase shift of approximately 90° between signals carried on the first and second signal path means;

carrier amplifier means having an output for amplifying a signal carried by a selected one of the first and second path means;

peaking amplifier means having an output for amplifying a signal carried by one of the first and second path means other than the selected one; and a quarter wave transformer/combiner integrated circuit coupled directly to the outputs of the carrier and peaking amplifier means for realizing a net relative phase shift of approximately 90° between the amplifier means outputs so the two are approximately in-phase, and combining the two to form one or more output signals.

7. The system of claim 1 implemented with solid state components.

8. An RF integrated circuit comprising:

an input splitter that splits an input signal into first and second portions;

a first signal path for carrying the first portion of the split input signal;

a second signal path for carrying the second portion of the split input signal;

at least one input phase shifter that realizes a net relative phase shift of approximately 90° between the first and second portions of the split input signal;

a carrier amplifier having an output within one of said first signal path and said second signal path;

a peaking amplifier having an output within the other of said first signal path and said second signal path; and a quarter wave transformer/combiner integrated circuit connected to the outputs of said carrier amplifier and said peaking amplifier, wherein said circuit realizes a net relative phase shift of approximately 90° between the output of said carrier amplifier and the output of said peaking amplifier so that the outputs are approximately in phase, and wherein said circuit combines the output of said carrier amplifier and the output of said peaking amplifier to form at least one output signal.

* * * * *